AUTOMATIC FREQUENCY CONTROL LOOP WITH FREQUENCY SCANNING

Filed June 6, 1966

Inventors
JEAN L. RIBOUR
LUCIEN J. HARDOUIN
By [signature]
Attorney

United States Patent Office 3,375,461
Patented Mar. 26, 1968

3,375,461

AUTOMATIC FREQUENCY CONTROL LOOP WITH FREQUENCY SCANNING

Jean Louis Ribour, Boulogne-Billancourt, Seine, and Lucien Jacques Hardouin, Sceaux, Seine, France, assignors to International Standard Electric Corporation, New York, N.Y., a corporation of Delaware Filed June 6, 1966, Ser. No. 555,547
Claims priority, application France, June 30, 1965, 22,949
9 Claims. (Cl. 331—4)

ABSTRACT OF THE DISCLOSURE

A stabilized, variable frequency source which automatically scans in the frequency spectrum until a selected output frequency is reached. When the output frequency is reached, the scanning is automatically stopped and the source is automatically placed under the control of a phase comparator to maintain the output frequency substantially constant. Primarily digital controls are utilized in the scanning and switching apparatus.

This invention concerns stabilized variable oscillators of the type used in radio frequency communications. It concerns, in particular, oscillators in which the setting controls the conversion rate between the frequency of the oscillator and the comparison frequency, and the oscillator starts by automatically effecting a frequency scanning controlled by a frequency comparator which stops this scanning when the comparison frequency becomes approximately equal to the reference frequency so as to then place the oscillator under the control of a phase comparator.

In known oscillators of this type, stopping of the frequency deviation and passage from frequency comparison to phase comparison are controlled by switching equipment. Frequency comparison is effected generally, by analog methods.

This invention applies to systems in which frequency divisions are effected by means of cyclic pulse counters. It provides a system in which frequency scanning is controlled, then stopped, and passage from frequency comparison to phase comparison is effected by very simple methods as digital and logic methods.

In accordance with a feature of the invention, frequency scanning is controlled by steps, starting with the upper limit, by the output pulses of the main frequency divider. As long as this main divider effects its metering cycles faster than the reference frequency divider, the reference frequency divider is, every time, reset to zero before having completed its metering cycle and without having delivered an output pulse, frequency scanning is continued. Frequency control by means of the above-mentioned pulses is controlled by the reference divider output pulses in such a manner as to be blocked by such pulses when these are delivered before those of the main divider, so that the frequency scanning is stopped as soon as the comparison frequency falls below the reference frequency and that the reference frequency divider also completes its metering cycle before the main divider does it. The phase comparator is connected, without switching equipment, to the outputs of both dividers, this comparator simply being inoperative during frequency deviation through the absence of reference pulses, is such a manner that it becomes operative as soon as the reference pulses are delivered and stop the frequency scanning.

In accordance with another feature of the invention, the frequency scanning is controlled, in a manner which is known in itself, by a pulse counter which processes the output pulses from the main divider (under the control of the reference divider) so as to, each time, reduce the frequency by one degree as stated hereabove.

Figure 1:
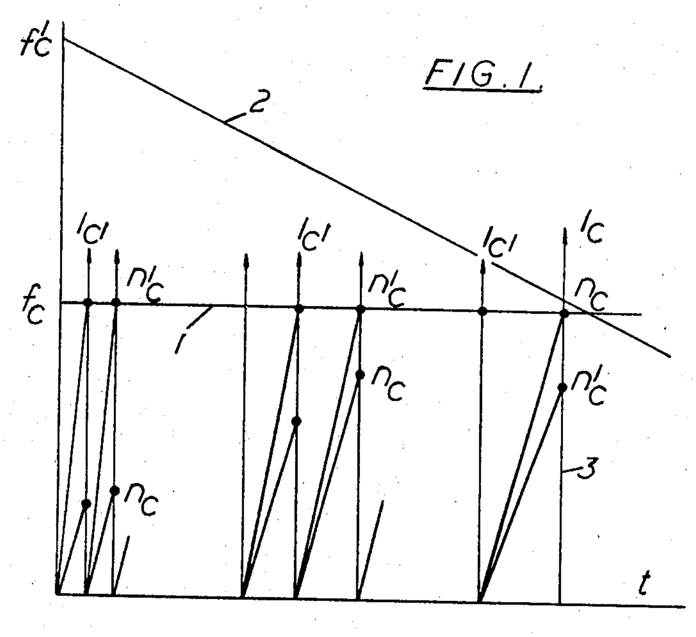
Figure 2:
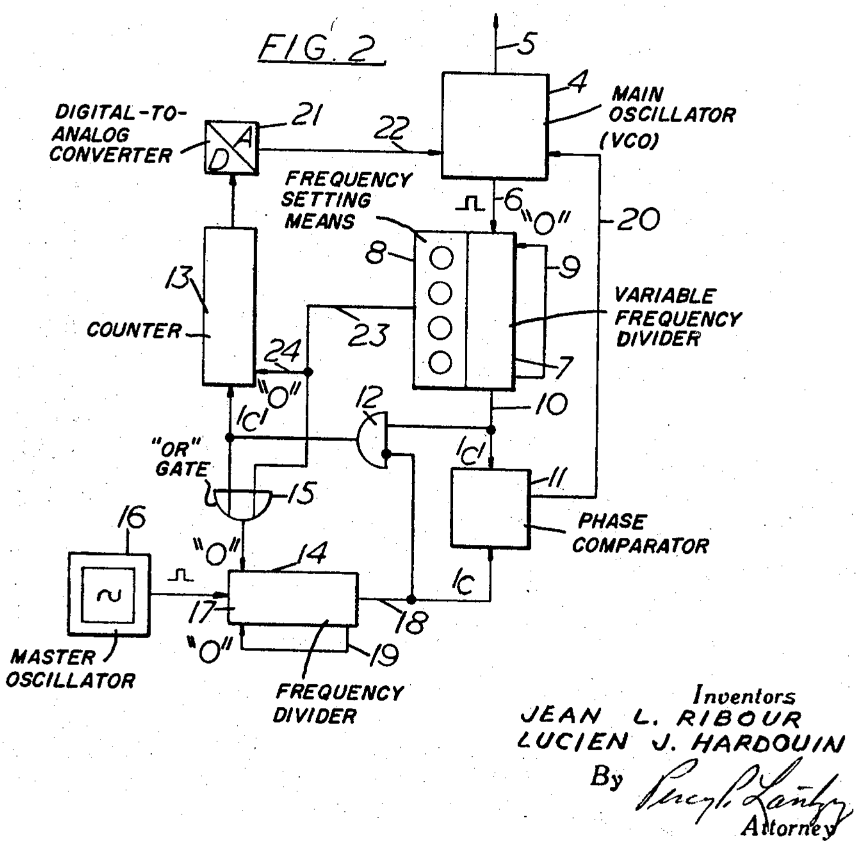

The invention will now be described more in detail with reference to the accompanying drawing in which:

FIGURE 1 shows a frequency scanning controlled in accordance with the invention, and FIGURE 2 is a block diagram showing an embodiment of the system according to the invention.

The general operation of oscillators covered by the invention will first be discussed. The main oscillator is capable of operating at different frequencies within more or less broad limits. Operational frequency is determined by a setting device and is stabilized through comparison with a reference frequency derived from a very stable master oscillator crystal). The comparison is made at a fixed frequency, between a comparison frequency derived from the main oscillator frequency and the reference frequency derived from the master oscillator frequency. The master oscillator frequency is converted into the reference frequency by a frequency divider which is a fixed cycle pulse counter. The main oscillator frequency is converted into the comparison frequency by a variable frequency divider which is a pulse counter with a cycle determined by setting. The main oscillator frequency is not directly controlled by setting. It is automatically controlled by means which are, themselves, controlled by the comparison device. When the oscillator is started up at a set frequency, the comparison device first operates as a frequency comparator to render the comparison frequency substantially equal to the reference frequency. As the conversion rate in the variable divider (which will be called hereafter the main divider), has been determined by setting, the main oscillator operates at the set frequency when the comparison frequency is equal to the reference frequency. Indeed, automatic control of the oscillator frequency is a frequency scanning controlled by an automatic scanning device which starts when the oscillator is started and which is controlled by the comparison device to stop the scanning when the set frequency is reached. As soon as this frequency is reached, the comparison device acts as a phase comparator so as to lock the comparison frequency at the reference frequency.

The phase comparator operation as understood herein, also includes a limited frequency regulation range. On the other hand, automatic control of the oscillator frequency does not exclude limited intervention from the setting device. For example, in order to change the frequency registers covered by the automatic scanning or to change the oscillator components which set the frequency in the various registers or which determine different registers when the oscillator is to operate within very broad frequency limits. For all these means or devices, it is necessary to refer, for example, to French Patent No. 1,321,475 (J. L. Ribour) and to French Patent No. 1,396,537 (J. L. Ribour). Finally, in a manner well-known in the art, the automatic scanning device is a pulse counter which receives successive pulses and which, at each counter step, vary the frequency by one degree by actuating components in the oscillator, such as variable capacitors, etc. In principle, one scanning range, that is to say, one frequency deviation, is sufficient to bring the main oscillator frequency to the set value and to pass to phase comparison operation.

FIGURE 1 shows how the frequency control operates in accordance with the invention. This consists of a graph where the times are shown on the abscissa and frequencies on the ordinates. Horizontal straight line 1 shows the fixed reference frequency $f_c$. Sloping line 2 shows the variable comparison frequency $f_c'$. This line starts at a higher value which corresponds (with respect to the conversion rates determined by setting in the variable divider), to the highest main oscillator frequency and which then decreases progressively. A straight line is shown although indeed, it may be a curve depending upon the periods between successive pulses applied to the counter controlling the scanning and upon the degrees of variation controlled in the oscillator through progression of this counter. The degrees of variation are not shown on line 2.

The reference frequency is that of the output pulses of the cyclic counter which forms the reference divider. Similarly, the comparison frequency is that of the output pulses from the cyclic counter which forms the main divider. At the beginning, the main divider effects its metering cycles faster than the reference frequency divider does. Each time that the main divider completes its count at the end of cycle $n_c'$ (which is determined by setting), it delivers a pulse $I_c'$. At this moment, the reference frequency divider, which has started at the same time as the main divider, only reaches a count $n_c$ which is not its cycle end count. Pulse $I_c'$ due to which the main divider pass to the following cycle, is used to re-set the reference frequency divider, the latter thus re-starts another cycle without having delivered its cycle end pulse. In this manner, during the entire frequency deviation period, only the main divider delivers cycle end pulses. These pulses $I_c'$ are applied to the counter which controls the scanning in such a manner that the frequency of the oscillator decreases by one degree after each cycle of the main divider. It will be understood that, since these cycles are numerically the same (for a given setting), whilst the frequency is decreasing, the successive pulses $I_c'$ are less and less frequent in time.

When the comparison frequency finally drops below the reference frequency, the reference frequency divider completes a cycle before the main divider, as shown by vertical line 3, and delivers its cycle end pulse $I_c$. At this moment, the main divider only attains a count $n_c'$ (on vertical line 3) which is not its cycle end count, but which is close to it. Pulse $I_c$ is used to inhibit the effect of further pulses $I_c'$ (since the main divider will continue its cycles) on the counter which controls the scanning on the counter which forms the reference frequency divider. In this manner, automatic control will remain at the frequency which has been reached and the reference frequency divider will continue its cycles without being re-set by further pulses $I_c'$.

The absence of reference pulses $I_c$ during the entire automatic frequency deviation makes it possible for the phase comparator to be connected to the outputs of the two dividers during this deviation. It then remains inoperative because of the absence of reference pulses. The phase comparator will automatically go into effective operation as soon as the reference divider delivers its output pulses $I_c$, that is to say, as soon as the frequency deviation has been stopped. No switching device, is, therefore, necessary in this system to effect passage from frequency comparison to phase comparison, with the exception of the electronic blocking operated by pulses $I_c$ on pulses $I_c'$ in the direction of the scanning counter and the reference frequency counter.

An arrangement of circuits, in accordance with the invention, is shown on FIGURE 2. Main oscillator 4 delivers the desired frequency at its operational output 5. One branch output 6 applies the same frequency (or a frequency at a pre-determined ratio with the operational frequency) to a variable frequency divider 7, the ratio of which is controlled by the frequency setting device 8. This divider is a cyclic counter in which the setting determines the numerical value of cycles. Cyclic operation is indicated by connection 9. At the end of each cycle, divider 7 delivers a pulse $I_c'$ at its output 10. This output is connected, firstly to a phase comparator input 11, and secondly, to the normal input of a gate 12 which is controlled by an inhibition input. It will be understood that this gate stands for any appropriate device. In the absence of any inhibition marking, the gate 12 delivers pulses $I_c'$ firstly to counter 13 which counts pulses $I_c'$ and secondly to the reference divider 14, for re-setting it every time. Pulses $I_c'$ reach divider 14 through an OR gate 15, which will be discussed hereafter.

The reference divider 14 receives the frequency from master oscillator 16 at its input 17. The reference divider output 18 is connected, firstly, to the other phase comparator input 11 and, secondly, to the inhibition input of gate 12. This divider is a pulse counter, the cyclic operation of which is indicated by connection 19. It has been stated hereabove that, during frequency deviation, pulses $I_c'$ interrupt the counting cycles of divider 14 by re-setting it at zero every time. Then, during normal operation at the reached frequency (slightly lower than the reference frequency), pulses $I_c$ are delivered. They block the gate 12 and actuate the phase comparator 11. The latter then delivers its phase regulation signal (and frequency regulation signal within a limited range), and applies it to main oscillator 4 through connection 20.

During frequency deviation, counter 13 reaches sucessive conditions after each pulse $I_c'$. These digital conditions are transmitted to a D/A converter 21 wherein they are converted into appropriate analog values such as control potentials. Connection 22 applies these analog values to appropriate components which set the frequency in oscillator 4. This device is such that the frequency decreases by one degree after each impulse $I_c'$ applied to counter 13.

Setting device 8 has an output 23 which delivers zero re-setting marking every time the operation frequency is changed by the operator. This marking is applied, firstly, to input 24 to reset at the scanning counter 13, and, secondly, to the "OR" gate 15, to reset the reference frequency divider 14. A connection, which is not shown, controls the reset of the main divider 7. It will be understood that the OR gate 15 stands for any suitable device to enable the reset of the divider 14, firstly through marking of a setting change, which is also applied to the reset input of the scanning counter 13 and, secondly, by pulses $I_c'$, which are also applied to the counting input of the same counter 13.

Examples will be found of numerical setting variable divider devices, and for conversions between the frequency of the main oscillator and the derived frequency to the divider (outputs 5 and 6), in the application for a French patent filed by the applicants on May 14, 1964 (J. L. Ribour—H. Garin).

It will be understood, of course, that the foregoing description does not limit the invention to the system described as an example and that various alternatives and component arrangements are possible within the scope of the invention, as set forth in the accompanying claims.

We claim:

1. A stabilized variable oscillator for providing a predetermined output frequency comprising:
   - a controllable variable frequency source;
   - a first frequency divider coupled to said controllable source;
   - a fixed frequency source;
   - a second frequency divider coupled to said fixed source;
   - first resetting means coupled to said first and second dividers for resetting said second divider to its initial state responsive to the output pulse of said first divider occurring before the output pulse of said second divider;
   - means coupled to said first and second dividers and to said controllable source for decreasing the frequency output of said controllable source responsive to the output pulse of said first divider occurring before the output pulse of said second divider; and
   - a phase comparator coupled to said first and second dividers and to said controllable source for causing said controllable source to lock on to said predetermined frequency.

2. A variable oscillator according to claim 1 wherein said first frequency divider has a variable division ratio for selecting a predetermined frequency output.

3. A variable oscillator according to claim 1 wherein said controllable source is a voltage controlled oscillator.

4. A variable oscillator according to claim 1 wherein said first resetting means comprises:

first gating means, one input thereof being coupled to the output of said first divider and the other input thereof being coupled to the output of said second divider, said gating means providing an output only when a signal level appears at the output of said first divider and no signal appears at the output of said second divider; and second gating means, one input thereof being coupled to the output of said first gating means and the output thereof being coupled to said second divider for resetting said second divider responsive to the presence of an input signal.

5. A variable oscillator according to claim 4 wherein said means for decreasing comprises:

counting means coupled to the output of said first gating means;

converting means coupled to the output of said counting means for converting the output of said counting means to a control signal for said controllable oscillator; and means coupling the output of said converting means to said controllable oscillator for controlling the frequency thereof.

6. A variable oscillator according to claim 4 further comprising second resetting means coupled to said first divider and to said second divider for resetting said second divider responsive to the division ratio of said first dividing means being changed.

7. A variable oscillator according to claim 6 wherein said second resetting means is coupled to said second dividing means via said second gating means, another input of said second gating means being coupled to said second resetting means.

8. A variable oscillator according to claim 6 wherein said second resetting means further comprises means coupled to said counting means for resetting said counting means responsive to the division ratio of said first dividing means being changed.

9. A variable oscillator according to claim 1, wherein said phase comparator is operative only when the output pulses from said second divider occur before the output pulses from said first divider.

References Cited

UNITED STATES PATENTS

| | | | |
|---|---|---|---|
| 3,164,777 | 1/1965 | Guanella | 331—18 X |
| 3,259,851 | 7/1966 | Brauer | 331—18 X |

ROY LAKE, *Primary Examiner.*

S. H. GRIMM, *Assistant Examiner.*